May 21, 1968 S. SHWARTZMAN 3,383,760

METHOD OF MAKING SEMICONDUCTOR DEVICES

Filed Aug. 9, 1965 3 Sheets-Sheet 1

INVENTOR.
STANLEY SHWARTZMAN
BY
Glenn A. Bruestle
Attorney

INVENTOR.
STANLEY SHWARTZMAN
BY
Glenn H. Bennettle
Attorney

METHOD OF MAKING SEMICONDUCTOR DEVICES

Filed Aug. 9, 1965 3 Sheets-Sheet 3

INVENTOR
STANLEY SHWARTZMAN
BY
Glenn H. Bruestle
Attorney

United States Patent Office 3,383,760
Patented May 21, 1968

3,383,760
METHOD OF MAKING SEMICONDUCTOR DEVICES

Stanley Shwartzman, Somerville, N.J., assignor to Radio Corporation of America, a corporation of Delaware Filed Aug. 9, 1965, Ser. No. 478,351
4 Claims. (Cl. 29—577)

ABSTRACT OF THE DISCLOSURE

A composite wafer of semiconductor components, separated from each other by glass, is severed along the glass into a plurality of parts. The parts are rearranged and joined to each other in a desired configuration. Some of the parts are turned over so that simple short connections may be made between the components on both sides of the device.

This invention relates generally to semiconductor devices, and more particularly to an improved method of making them. The improved method is especially useful for making novel modules of the integrated circuit type. While the invention will be described, for illustrative purposes, by an improved method of making novel modules comprising semiconductor diodes, many other types of semiconductor devices may also be made by this improved method.

In the manufacture of some integrated circuits using semiconductor materials and employing photolithographic techniques, a relatively large number of operations, some of which are repetitive, must be performed to form the different components and interconnections of the circuits. Thus, for example, the operations of (1) applying a photoresist to a semiconductor wafer (2) exposing the photoresist, ad (3) etching the photoresist may have to be repeated many times during the manufacture of a single integrated circuit. Where all of the components to be formed on, or in, a semiconductor wafer are the same and similarly oriented, the number of photolithographic operations to form them is usually less than it would be if some or all of the components to be formed were different from each other. While the former arrangement of similar and similarly oriented components may be made more economically than the latter arrangement of dissimilar components, the similar components are usually not oriented properly for efficient interconnection in many desired circuit modules.

It is an object of the present invention to provide an improved method of making semiconductor modules more economically than necessitated by conventional prior art methods.

Another object of the present invention is to provide an improved method of making semiconductor devices or circuit modules that utilizes a relatively inexpensive semiconductor wafer comprising a plurality of similar components.

A further object of the present invention is to provide an improved method of making novel rectifying modules of relatively low cost and good performance.

The improved method of making novel semiconductor devices will be described in connection with the manufacture of power rectifiers.

In one embodiment, a composite wafer of components, separated from each other by insulating material, is severed along the insulating material into at least two separate parts, and the parts are re-arranged in a desired configuration, or orientation. The parts are fixed to each other in the desired configuration, so that selected components may be electrically interconnected to form the desired circuit. The components may have contact areas or terminals on opposite major surfaces of the composite wafer, and at least one of the parts of the composite wafer, when severed may be turned over in the aforementioned desired configuration. Thus, in a desired configuration, a terminal of one component originally on one major surface of the composite wafer may be disposed in a coplanar and adjacent relationship with a terminal of another component originally on an opposing major surface of the composite wafer, whereby to facilitate an electrical connection therebetween. The improved method lends itself well to the manufacture of novel modules of serially-connected rectifiers and rectifier bridges.

The novel features of the invention, as well as additional objects and advantages thereof, will be more readily understood from the following description, when read in connection with the accompanying drawings, in which similar reference characters represent similar parts throughout, and in which.

Figure 4:
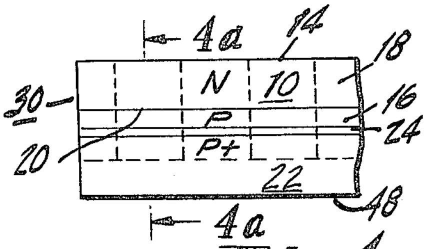
FIG. 4 is a fragmentary, front-elevational view of the wafer and substrate fixed to each other to form a block, the dashed lines in the figure representing planes along which cuts are to be made to form grooves in the block, as illustrated in FIG. 4*a*.
Figure 4B:
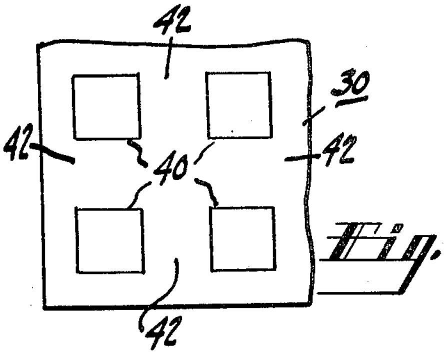
Figure 4A:
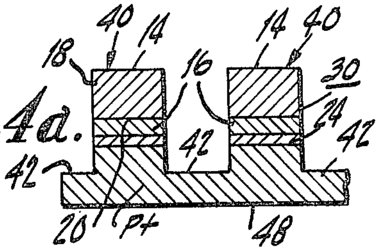
Figure 5:
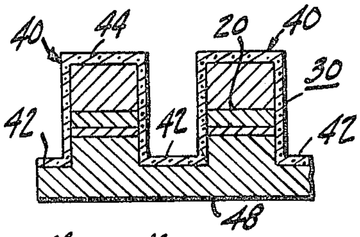
Figures 6, 7:
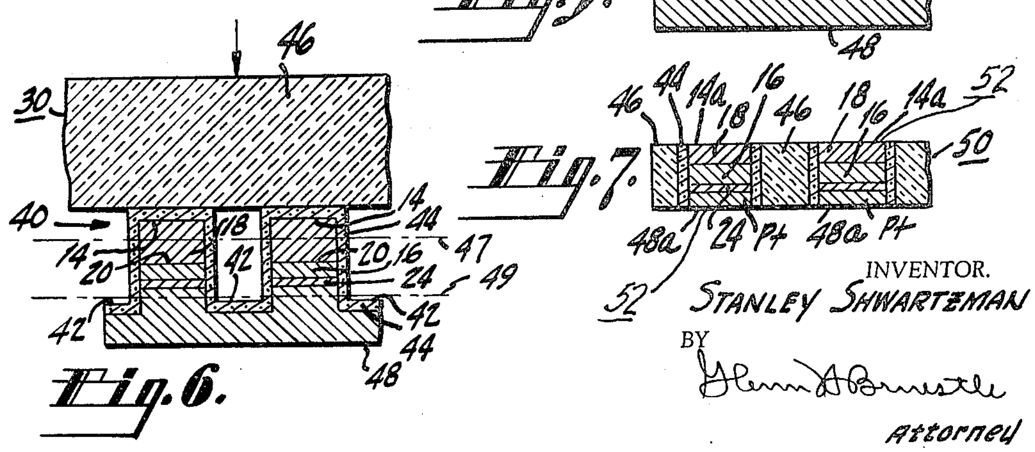
Figures 8, 9, 10, 10A:
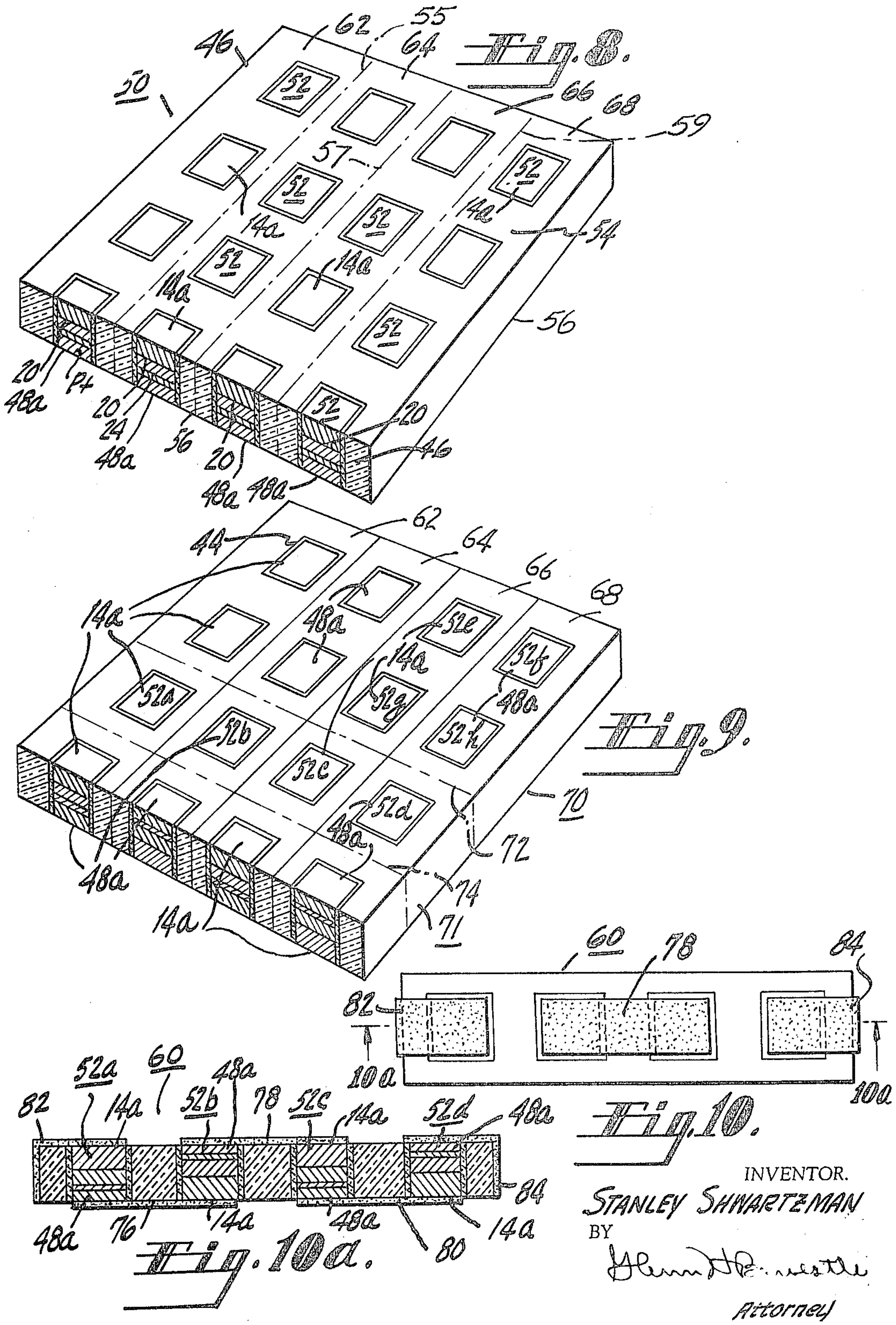
Figure 11:
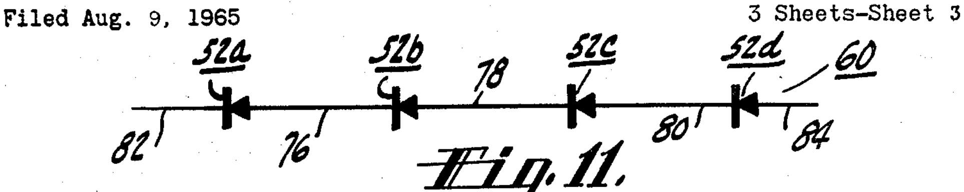
Figure 12:
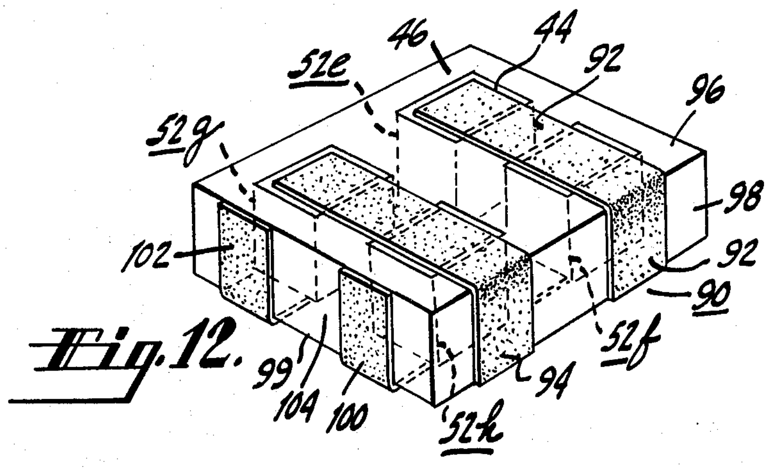
Figures 12A, 13:
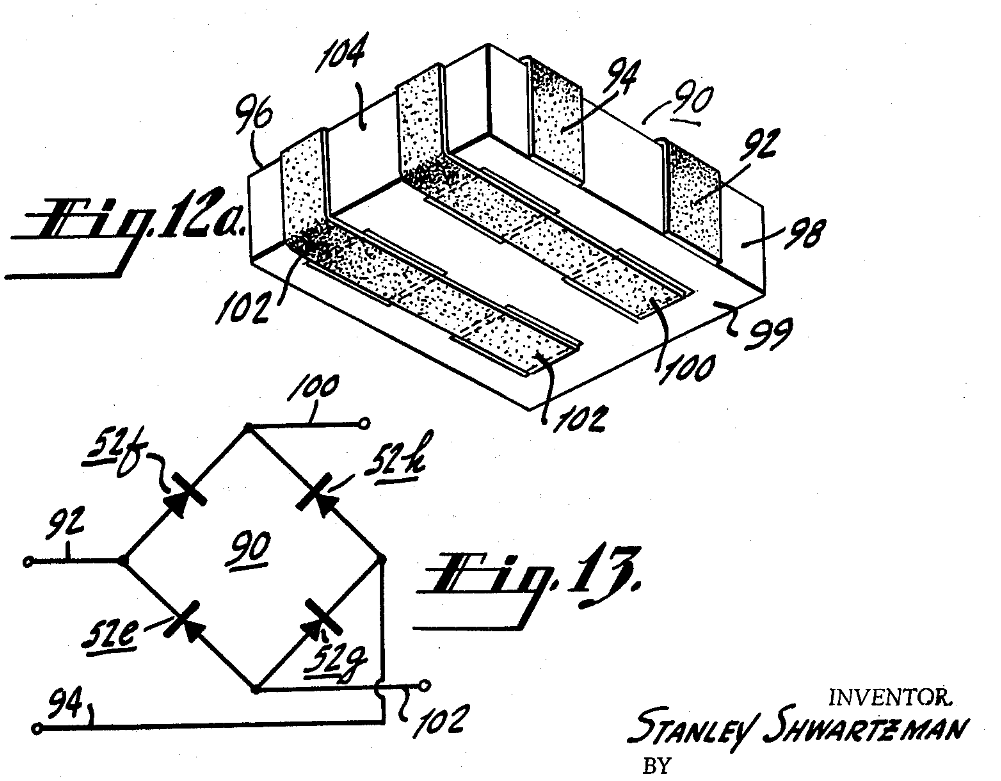

FIG. 4*a* is a fragmentary, cross-sectional view of the grooved block, taken along the line **4*a*** in FIG. 4 and viewed in the direction indicated by the arrows;

FIG. 4*b* is a fragmentary, plan view of the grooved block illustrated in FIG. 4*a*;

FIGS. 5 and 6 are fragmentary, cross-sectional views, similar to that of FIG. 4*a*, showing different steps in the improved method;

FIG. 7 is a fragmentary, cross-sectional view of a composite wafer of passivated semiconductor components included between the horizontal planes illustrated in FIG. 6, after insulating material has been pressed into the grooves of the grooved block;

FIG. 8 is a top perspective view of the composite wafer illustrated in FIG. 7, the broken lines indicating the planes through which cuts are to be made to divide the composite wafer into parts;

FIG. 9 is a top perspective view of a desired configuration formed from rearranged parts of the wafer illustrated in FIG. 8;

FIG. 10 is a semiconductor module included between the parallel planes illustrated by the broken lines in FIG. 9;

FIG. 10*a* is a cross-sectional view of the module in FIG. 10 taken along the line **10*a*** and viewed in the direction indicated by the arrows;

FIG. 11 is a schematic diagram of a circuit of the module in FIG. 10;

FIGS. 12 and 12*a* are perspective views of a portion of the composite wafer illustrated in FIG. 9, viewed from above and below, respectively, showing electrical connections between components thereon to form a bridge circuit; and FIG. 13 is a schematic diagram of the bridge circuit of the module illustrated in FIGS. 12 and 12*a*.

Figure 1:
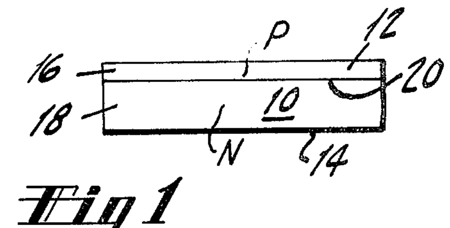
FIG. 1 is a fragmentary, front-elevational view of a wafer of semiconductor material used in the improved method of making semiconductor devices.

Referring, now, particularly to FIG. 1 of the drawings, there is shown a portion of a wafer 10 of a single crystal of semiconductor material, such as silicon, germanium, or gallium arsenide. The wafer 10 may be about 1 inch square with a thickness of between 4 and 12 mils, having, as viewed in FIG. 1, upper and lower opposed major surfaces 12 and 14, respectively. The descriptive terms, such as "upper" and "lower," for example, are merely relative and are used herein for ease of description and not in a limiting sense.

Acceptor and donor impurities may be diffused through the opposed surfaces 12 and 14 of the wafer 10, as by any double diffusion method known in the art, to form P type and N type zones 16 and 18, respectively, therein. This double diffusion can be controlled by means known in the art so that the P type zone 16 extends inwardly from the surface 12 to a depth of about 2 mils, forming a PN junction 20 with the N type zone 18. The PN junction 20 comprises a plane that is substantially parallel to the opposed major surfaces 12 and 14 of the wafer 10.

Instead of utilizing the aforementioned double diffusion method, the PN junction 20 can be formed by a single diffusion of a P type impurity into an N type wafer. The PN junction 20 can also be formed by an epitaxial growth process known in the art.

The wafer 10 is fixed to a suitable substrate to facilitate the handling and subsequent treatment of the wafer 10. Thus, the wafer 10 is fixed to a substrate 22 (FIGS. 3 and 4), such as a highly doped P type wafer of silicon (designated P+) which can also become a portion of a finished semiconductor device. The wafer 10 and the substrate 22 should be of material having substantially the same thermal coefficient of expansion to provide a structurally stable finished product.

Figure 2:
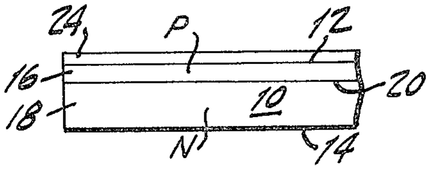
FIG. 2 is a fragmentary view of the wafer illustrated in FIG. 1, showing a step in the improved method.

The wafer 10 and the substrate 22 can be joined together by a hot-pressing operation. If the abutting surfaces of the wafer 10 and the substrate 22 are etched, it is preferable to coat one of the abutting surfaces with a layer 24 of a metal such as chromium, nickel, niobium, zirconium, or titanium, for example. Thus, the layer 24 of metal may be applied to the surface 12 of the wafer 10, as shown in FIG. 2, either by a process of evaporation, plating, or dipping the wafer 10 in a fine powder of the metal, or inserting a thin metal foil between the wafer 10 and the substrate 22. The thickness of the layer 24, as well as dimensions of other parts herein, has been exaggerated in the drawing for the sake of clarity. Preferably, the thickness of the layer 24 of metal is between 1,000 A. and 100,000 A.

Figure 3:
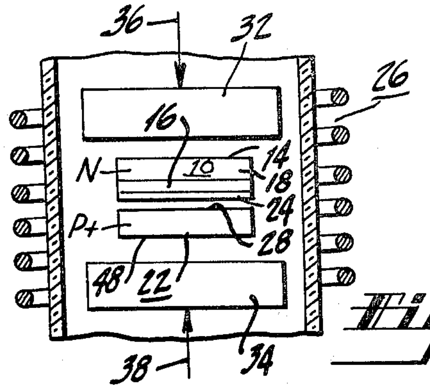
FIG. 3 is a fragmentary, cross-sectional view of a portion of an induction furnace, showing an exploded, reduced view of portions of the wafer and a substrate in a step in the improved method.

The hot-pressing operation of the wafer 10 to the substrate 22 can be carried out under pressure in an induction furnace 26, as shown in the exploded view of FIG. 3. The layer 24 of metal on the wafer 10 is disposed against the adjacent surface 28 of the substrate 22 to form a block 30 (FIG. 4). The wafer 10 and the substrate 22 are inserted between carbon plates 32 and 34 so that pressure, in the direction indicated by the arrow 36 and 38, can be applied to opposite sides 14 and 48, respectively, of the block 30 while sufficient heat is supplied by the induction furnace 26 to diffuse the metal layer 24 into the wafer 10 and substrate 22 and thus join them together to form the block 30. Where the layer 24 is of chromium or titanium, the hot-pressing operation can be carried out at a temperature between 950° C. and 1,400° C. and at a pressure of between 200 p.s.i. and 5,000 p.s.i. The hot pressing operation should be done in a vacuum or in a neutral or reducing atmosphere, such as argon or hydrogen. Lower temperatures and pressures can be used for germanium or III–V semiconductor materials, as, for example, gallium arsenide.

After the block 30 is formed, a plurality of mesas 40 are formed in the block 30 by cutting a plurality of grooves 42 therein, as shown in FIGS. 4*a*, 4*b*, and 5. The dashed lines on the block 30 in FIG. 4 illustrate planes along which cuts are made to form the mesas 40. Each of the grooves 42 extends completely through the wafer 14 and partially through the substrate 22 to form a plurality of substantially similar mesas 40 in a substantially regular pattern, as shown in the plan view of FIG. 4*b*. The grooves 42 may be cut from the block 30 by chemical and electrolytic etching, sand blasting, sawing, grinding, or ultrasonic machining (cavitroning), for example.

It is desired to press an electrical insulating material, such as softened glass, into the grooves 42, but, since most glasses contain impurities that may adversely affect the PN junction 20, it is desirable to coat the top surface 14 of each of the mesas 40 and those portions of the wafer 10 and the substrate 22 that define the grooves 42 with a layer 44 of electrically inert material, such as silicon dioxide, for example. The layer 44 of silicon dioxide can be deposited by any means known in the art, as by direct oxidation of the wafer 10 if it itself is silicon, by the evaporation of silicon dioxide ($SiO_2$ or SiO in $O_2$), by the vapor phase decomposition of organosilanes, or by the hydrolysis or oxidation of silicon halides, for example. The silicon dioxide may be modified with other oxides, such as phosphosilicate, borosilicate, or lead silicate, for example, where the wafer 10 is gallium arsenide or germanium. If a glass of high purity (inert to the PN junction) is available, the layer 44 may be omitted. The thickness of the layer 44 is preferably between 3,000 A and 10,000 A.

A wafer of glass 46 (FIG. 6), heated to the softening point, may now be pressed into the oxide-coated grooves 42. The induction heating furnace 26, shown in FIG. 3, may be used to soften the glass 46. Pressure may be applied between the glass 46 and the substrate 22 by placing the glass 46 on the surface 14 of each coated mesa 40 and pressing the assembly between the blocks 32 and 34 with a pressure of between 20 p.s.i. and 5,000 p.s.i., the temperature of the glass 46 being sufficient to cause it to soften. Although the deposition of the glass 46 into the grooves 42 is accomplished easily by the operation of hot pressing, as described, other means of depositing the glass, such as by allowing it to sag into place, sedimentation, fusion, or vapor deposition, may also be employed. Several types of glass 46 that have good thermal expansion characteristics for use with silicon and other semiconductor materials are commercially available. For example, Corning #7070 glass or Owens-Illinois glass #KG 33 may be used with silicon wafers 10. Corning #7520 glass or Owens-Illinois #N 10 glass may be used satisfactorily with wafers of germanium or gallium arsenide.

When the glass 46 has cooled and solidified in the grooves 42, the opposed major surfaces of the block 30 are lapped to the planes 47 and 49, respectively, indicated by the parallel broken lines in FIG. 6, to provide a first composite wafer 50, as shown in FIG. 7. The composite wafer 50 now comprises a plurality of similarly oriented rectifying components, or diodes 52 (previously mesas 40), each physically separated and electrically insulated from the other by the glass 46. Opposed major surfaces 54 and 56 of the composite wafer 50 are planar and include opposite exposed surfaces, that is, contact areas, or terminals 14*a* and 48*a*, respectively, of the diodes 52, as shown in FIGS. 7 and 8.

The similarly oriented diodes 52 in the composite wafer 50 are not conveniently oriented for electrical connections therebetween to form certain desired modules, such as a serially-connected rectifier stack 60 (FIGS. 10 and 10*a*), for example. Accordingly, the composite wafer 50 is separated into a plurality of parts, such as parts 62, 64, 66, and 68, by cutting through the glass 46 along the broken lines 55, 57, and 59, shown in FIG. 8.

The parts 62–68 may now be re-arranged in a desired configuration. For example, the parts 64 and 68 are turned over, that is, rotated 180° about their long axes, as shown in FIG. 9. The parts 62–68 are now re-assembled to form the desired configuration, a planar composite wafer 70. The parts 62–68 may be fixed to each other, in the form of the composite wafer 70, by re-heating them in the induction furnace 26 until the glass 46 softens and the parts adhere to each other. Sufficient pressure may be exerted against the parts 62–68 to cause them to adhere to each other when the glass is softened, if necessary. Other methods of fixing the parts 62–68 to each other, such as by means of suitable glues, plastics or metal leads, may also be used. Although the composite wafer 50 has been shown as being severed into four parts and re-arranged into the configuration of the composite wafer 70, the composite wafer 50 may be divided into two or more parts for re-assembly into any desired configuration. Also, the composite wafer 70 may be made from the parts of different severed wafers. For example, the parts 62, 64, 66 and 68 may be from four separate composite wafers 50, respectively.

To form the serially-connected rectifier stack 60, (FIGS 10 and 10*a*), comprising four serially connected diodes 52, a section 71, included between two parallel planes, designated by broken lines 72 and 74 (FIG. 9), of the composite wafer 70 is removed. The section 71 may be removed by cutting through the glass 46, along the lines 72 and 74 by any suitable means, such as by ultrasonic machining, sand blasting, or chemical etching, for example.

Some of the diodes 52 in FIG. 9 and in subsequent figures will be designated with an additional reference letter merely for designating the relative position of a particular diode 52 in a particular arrangement.

Suitable connections may now be made on the removed section 71 to form the serially connected rectifier stack 60, as shown in FIGS. 10 and 10*a*. To this end, the terminal **48*a* of one diode 52*a*** (FIG. 10*a*) in the module 60 is connected to the terminal **14*a* of the adjacent diode 52*b*, as by a connection 76** of metallic paint (FIG. 10*a*), for example, and the terminal **48*a*, of the diode 52*b* is connected to the terminal 14*a* of the adjacent diode 52*c* by a painted electrical connection 78. Similarly, the diode 52*d* is serially connected to the diode 52*c* by a painted electrical connection 80. Terminal connections 82 and 84 for the serially-connected rectifier stack 60 may be painted to the terminals 14*a* and 48*a* of the diodes 52*a* and 52*d***, respectively. Thus, adjacent diodes, suitably oriented on a section of diodes, can be connected into the serially-connected rectifier stack by merely connecting adjacent diodes with relatively short connections on opposite sides of the section.

Instead of painting the connections, they can be made by the evaporation of metals, by soldering wires, by attaching conducting clips, or by any other method known in the art.

FIG. 11 illustrates the schematic diagram of the rectifier module 60 wherein the diodes **52*a*–52*d* are connected in series by the connections 76–80, and wherein the terminals of the module 60 are terminals 82 and 84**.

Referring now, particularly to FIGS. 12 and 12*a*, there is shown a bridge rectifier module 90 that comprises a section 91 (FIG. 9) of the re-arranged composite wafer 70, which section 91 includes four of the diodes 52, designated as **52*e*, 52*f*, 52*g*, and 52*h*. The terminals 14*a* and 48*a* (FIG. 9) of the diodes 52*e* and 52*f*, respectively, are electrically connected to each other by a conductor 92 (FIG. 12), such as metallic paint; and the terminals 14*a* and 48*a* of the diodes 52*g* and 52*h*, respectively, are similarly connected by a conductor 94. The conductors 92 and 94 may extend from a major surface 96 of the module 90 to an adjacent surface 98 to provide convenient access for electrical connections thereto. On a major surface 99, opposite the major surface 96, of the module 90, the terminals 14*a* and 48*a* of the diodes 52*f* and 52*h*, respectively, are connected to each other by a conductor 100; and the terminals 48*a* and 14*a* of the diodes 52*e* and 52*g*, respectively, are similarly connected by a conductor 102. The conductors 100 and 102 may also extend from the major surface 99 to an adjacent surface 104 to provide convenient means for connecting the module 90** in a desired circuit.

FIG. 13 illustrates schematically the circuit of the bridge rectifier module 90. In FIG. 13, the conductors 92 and 94 represent input terminals across which to apply an A–C voltage for rectification, and the conductors 100 and 102 represent output terminals across which a rectified voltage may be derived in a manner well known in the art.

Thus, there has been described herein an improved method of making circuit modules, utilizing relatively inexpensive composite wafers of similarly oriented, electrically isolated components. While the composite wafer utilized in the examples of making novel rectifier modules comprised a plurality of similar diodes, composite wafers including other components, such as transistors, for example, may also be used in the improved method to make other novel circuit modules. Also, at least some severed parts, from different wafers having different components, respectively, may be fixed to each other to form a desired configuration, whereby to facilitate circuit connections between the components in the new configuration. Hence, variations in the components as well as in the operations of the method, all coming within the spirit of this invention, will, no doubt, suggest themselves to those skilled in the art. It is, therefore, desired that the foregoing be considered as illustrative and not in a limiting sense.

What is claimed is:

1. A method of making a semiconductor circuit module from a planar composite first wafer comprising a plurality of similar components of semiconductor material similarly oriented in said composite first wafer, said components being separated from each other by glass adhered thereto and having contact areas on opposed major surfaces of said composite first wafer, respectively, said method comprising:
- severing said composite first wafer along said glass into a plurality of parts,
- turning over at least one of said parts and rearranging at least some of said parts, including said one part, in a desired contiguous configuration,
- heating said parts to soften and bond said glass and to fix said parts to each other in said configuration to form a planar second wafer,
- removing a section from said second wafer, said section containing at least two components, and
- electrically connecting said components in said section, whereby to form said circuit module.

2. A method of making a semiconductor circuit module comprising:
- providing a wafer of semiconductor material having two opposed major surfaces and a PN junction therebetween and parallel thereto,
- forming a plurality of grooves in said wafer, each of said grooves extending through one of said surfaces and said PN junction of said wafer, whereby to form a plurality of mesas, each of said mesas including a portion of said PN junction,
- depositing adherent heat-softenable electrical insulating material in said grooves,
- exposing opposed surfaces of each of said mesas on said opposed major surfaces of said wafer and insulating said mesas from each other, whereby to form a first composite wafer of semi-conductor components separated from each other by said insulating material,
- severing said first composite wafer along said insulating material into at least two separate parts, said parts retaining portions of said insulating material,
- turning over at least one of said parts and rearranging said parts in a desired contiguous configuration,
- heating said configuration to soften and bond said insulating material to fix said parts in said configuration, whereby to form a second composite wafer,
- removing a section from said second composite wafer, said section containing at least two components, and electrically interconnecting said components on said section to form said circuit module.

3. A method of making a rectifier circuit module comprising:
- providing a wafer of semiconductor material having two opposed major surfaces and a PN junction therebetween and substantially parallel thereto, forming a plurality of grooves in said wafer, each of said grooves extending through said PN junction, whereby to form a plurality of substantially similar mesas, each of said mesas being similarly oriented and including a portion of said PN junction, filling said grooves with a heat-softenable, adherent electrical insulating material, lapping opposed major surfaces of said wafer substantially parallel to said PN junction to expose the semiconductor material to each of said mesas, whereby to form a first composite wafer of components separated by said insulating material, opposite major surfaces of said first composite wafer including opposite surfaces of said components, respectively, and each of said components having a rectifying PN junction, cutting said first composite wafer through said insulating material into at least two separate parts, turning at least one of said parts over and rearranging said parts contiguously in a desired configuration, whereby said components in said parts that are turned over are oriented adjacent to certain ones of said components in other of said parts, heating said configuration to soften and bond said insulating material to join said parts permanently in said configuration to form a second composite wafer, and electrically interconnecting said components on at least a section of said second composite wafer to form said rectifier module.

4. A method of making a bridge rectifier module with the aid of a wafer of silicon having a PN junction substantially parallel to its opposed major surfaces, said method comprising the steps of:

forming a plurality of grooves in said wafer, each of said grooves extending through said PN junction, whereby to form a plurality of mesas each having at least a portion of said PN junction therein, oxidizing the surfaces of said mesas and portions of said wafer that define said grooves to form a layer of silicon dioxide thereon, filling said grooves with adherent heat-softened glass, lapping said opposed major surfaces of said wafer until said mesas are completely separated from each other by said glass and opposed surfaces of said silicon of said mesas are coplanar with opposed surfaces of said glass, respectively, said mesas and said glass comprising a first composite wafer of similarly oriented diodes, cutting through said glass to divide said first composite wafer into a plurality of parts, turning over at least one of said parts having at least two diodes and disposing it adjacent to another of said parts having at least two diodes, whereby to form a second composite wafer, heating said parts in said second composite wafer until said glass softens and bonds, whereby to join said parts in said second composite wafer, and electrically connecting said two diodes in said one part with said two diodes in said other part to form said bridge rectifier module.

References Cited

UNITED STATES PATENTS

| | | | |
|---|---|---|---|
| 2,865,082 | 12/1958 | Gates | 29—583 |
| 3,152,939 | 10/1964 | Borneman. | |
| 3,193,418 | 7/1965 | Cooper | 29—583 X |
| 3,235,428 | 2/1966 | Naymik | 29—577 X |
| 3,239,908 | 3/1966 | Nakamura | 29—577 |
| 3,307,239 | 3/1967 | Lepselter | 29—577 |
| 3,290,753 | 12/1966 | Chang | 29—577 |

WILLIAM I. BROOKS, *Primary Examiner.*